(12) United States Patent
Lee et al.

(10) Patent No.: US 12,132,082 B2
(45) Date of Patent: Oct. 29, 2024

(54) CHANNEL MOBILITY IMPROVEMENT

(71) Applicant: Taiwan Semiconductor Manufacturing Co., Ltd., Hsinchu (TW)

(72) Inventors: Pei-Wei Lee, Hsinchu (TW); Yasutoshi Okuno, Hsinchu (TW); Pang-Yen Tsai, Hsin-chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 160 days.

(21) Appl. No.: 17/871,464

(22) Filed: Jul. 22, 2022

(65) Prior Publication Data

US 2022/0359662 A1 Nov. 10, 2022

Related U.S. Application Data

(62) Division of application No. 16/943,751, filed on Jul. 30, 2020, now Pat. No. 11,430,867.

(60) Provisional application No. 62/965,564, filed on Jan. 24, 2020.

(51) Int. Cl.
| | |
|---|---|
| H01L 21/02 | (2006.01) |
| H01L 21/66 | (2006.01) |
| H01L 29/04 | (2006.01) |
| H01L 29/10 | (2006.01) |
| H01L 29/66 | (2006.01) |
| H01L 29/78 | (2006.01) |

(52) U.S. Cl.
CPC .......... *H01L 29/1037* (2013.01); *H01L 22/12* (2013.01); *H01L 29/045* (2013.01); *H01L 29/66795* (2013.01); *H01L 29/785* (2013.01); *H01L 2029/7858* (2013.01)

(58) Field of Classification Search
CPC ... H01L 29/1037; H01L 22/12; H01L 29/045; H01L 29/66795; H01L 29/785; H01L 2029/7858; H01L 21/02027; H01L 29/0673; H01L 29/42392; H01L 29/66439; H01L 29/78696; H01L 29/775; H01L 21/823412; H01L 21/823431; H01L 29/1033; H01L 29/1079; B82Y 10/00

See application file for complete search history.

(56) References Cited

U.S. PATENT DOCUMENTS

| | | | |
|---|---|---|---|
| 6,559,518 B1 * | 5/2003 | Niwa | ................ H01L 21/28194 257/E29.345 |
| 9,818,872 B2 | 11/2017 | Ching et al. | |
| 9,887,269 B2 | 2/2018 | Ching et al. | |
| 9,899,398 B1 | 2/2018 | Colinge et al. | |
| 9,984,936 B1 | 5/2018 | Xie | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,290,546 B2 | 5/2019 | Chiang et al. | |

(Continued)

*Primary Examiner* — Cuong B Nguyen

(74) *Attorney, Agent, or Firm* — HAYNES AND BOONE, LLP

(57) ABSTRACT

A semiconductor device according to the present disclosure includes a substrate including a plurality of atomic steps that propagate along a first direction, and a transistor disposed on the substrate. The transistor includes a channel member extending a second direction perpendicular to the first direction, and a gate structure wrapping around the channel member.

20 Claims, 11 Drawing Sheets

(56) References Cited

U.S. PATENT DOCUMENTS

| | | |
|---|---|---|
| 10,475,902 B2 | 11/2019 | Lee et al. |
| 2006/0197108 A1* | 9/2006 | Gardner ................ H01L 29/402 |
| | | 257/E27.062 |
| 2011/0006310 A1 | 1/2011 | Nagasawa |
| 2013/0216780 A1 | 8/2013 | Pokroy |
| 2018/0175036 A1 | 6/2018 | Ching et al. |
| 2018/0190809 A1* | 7/2018 | Huang ................ H01L 27/0886 |
| 2020/0006559 A1* | 1/2020 | Mehandru ........... H01L 29/6653 |
| 2020/0043728 A1 | 2/2020 | Lee |

* cited by examiner

CHANNEL MOBILITY IMPROVEMENT

PRIORITY DATA

This application is a divisional application of U.S. patent application Ser. No. 16/943,751, filed Jul. 30, 2020, which claims priority to U.S. Provisional Patent Application Ser. No. 62/965,564, filed Jan. 24, 2020, the entire disclosure of which is hereby incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

Multi-gate devices, such as gate-all-around (GAA) transistors or fin-type field effect transistors (FinFETs), are implemented to meet modern-day requirements for high-performance and high-density IC devices. Taking a GAA transistor as an example, it includes gate structures that wrap completely around channel members to provide improved channel control and to combat short channel effect (SCE). The channel members of a GAA transistor are formed from a stack of alternating layers of semiconductor materials epitaxially grown on a substrate. The substrate, which is usually formed of silicon, includes atomic steps resulting from its manufacturing process. Due to reduced dimensions of the channel members, such atomic steps may cause scattering of charge carriers and reduce carrier mobility in the channel members. The reduced carrier mobility may lead to reduced performance of channel members of the GAA transistor formed thereon. Therefore, while conventional multi-gate structures may be generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
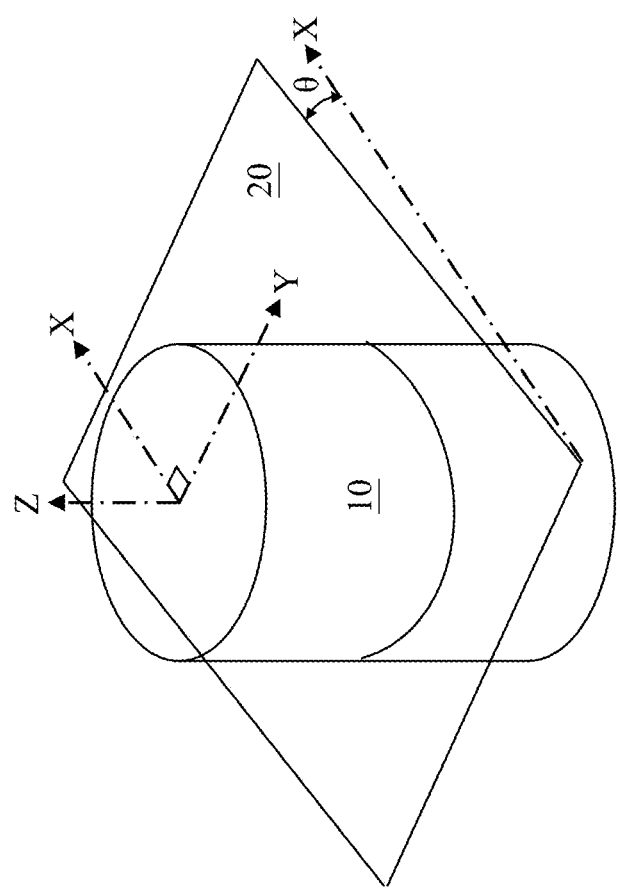
FIG. 1 illustrates a single crystal ingot and a slicing direction relative to the single crystal ingot, according to aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

There are several reasons why fabrication of semiconductor devices takes place on a single-crystal semiconductor substrate, such as a single-crystal silicon substrate. One of the reasons is the need for long carrier lifetime, which may depend on defects at grain boundaries, degrees of chemical purity, and degrees of crystal perfection. Single-crystal semiconductor substrates, with fewer defects, uniform compositions, and uniform crystal structures, become a natural choice. Single-crystal silicon (Si) substrates are among the most common among single-crystal semiconductor substrates.

Manufacture of single-crystal silicon substrates aims at purification and crystalline structure perfection. Reference is first made to FIG. 1, which illustrates a single-crystal silicon ingot 10. The single-crystal silicon ingot 10 is grown from melts of electronic grade polycrystalline silicon (EGS) which comes from purification of raw silicon in the form of quarzite. Quarzite has a high level of impurities, such as aluminum, boron and iron. To obtain EGS, a rigorous refinement process is necessary. In an example refinement process, raw quarzite is first reduced to metallurgical grate silicon (MGS) with a silicon content of about 98%. Specifically, silicon oxide in quarzite is reacted with carbon to be reduced to MGS, with carbon monoxide as a byproduct. MGS is ground to fine power and allowed to react with anhydrous hydrogen chloride in the presence of catalyst to form trichlorosilane. As trichlorosilane is a liquid at room temperature, it can be further purified by fractional distillation to remove impurities. The purified trichlorosilane is then converted back into solid silicon using a chemical vapor deposition (CVD) process. In the CVD process, silicon is deposited on a silicon substrate by reacting gaseous form of trichlorosilane and hydrogen. The resultant polysilicon rod consists of EGS.

Czochralski method or a float zone process may be used to form EGS into a single-crystal silicon ingot 10. When the Czochralski method is used, EGS is melted in a fused silica crucible at a temperature greater than the melting point of silicon, which is about 1421° C., a silicon crystal seed is then lowered into the molten EGS and pulled at a controlled rate away from the molten EGS while being rotated. When the float zone process is used, a high-purity polysilicon rod is first formed from EGS and is disposed on a monocrystalline silicon seed. A radio-frequency (RF) heating coil moves along the high-purity polysilicon rod, allowing partially melted polysilicon to be in contact with partially melted monocrystalline silicon seed. As a result, the molten silicon solidifies into an ingot like the single-crystal silicon ingot 10 shown in FIG. 1. In some examples, the single-crystal silicon ingot 10 includes a longitudinal direction along the [100] crystal direction that is normal to the (100) crystal plane. In FIG. 1, the Z direction may be parallel to the [100] crystal direction. The X direction and the Y direction may correspond to the [110] crystal direction and the [−110] crystal direction of the single-crystal silicon ingot 10.

After the single-crystal silicon ingot 10 is formed, operations are performed to obtain single-crystal silicon wafers. In an example process, the single-crystal silicon ingot 10 is first ground using diamond wheels into cylindrical shapes. Depending on the diameters of the final wafers, flats or notches may be formed on the longitudinal side surface of the cylindrical single-crystal silicon ingot 10 to indicate crystal directions. After the flats or notches are formed, a wafer saw may be used to saw the cylindrical single-crystal silicon ingot 10 into raw wafers along a slicing plane 20. As illustrated in FIG. 1, the slicing plane 20 may not be coplanar with the X-Y plane but may be at a tilt angle θ to the X-Y plane with respect to the X direction in FIG. 1. The slicing plane 20 and the X-Y plane share the Y-direction. In the embodiments represented in FIG. 1, the X-Y plane may be the (100) crystal plane. In some instances, the tile angle θ may be between about 1° and about 4°. Even when sawn at the tile angle θ out of a single-crystal silicon ingot 10, a substantially circular wafer 100 shown in FIG. 2 may be resulted. The wafer 100 is then ground to a desired thickness and the edge of the wafer 100 is rounded. To ensure surface levelness, a planarization process, such as a chemical mechanical polishing (CMP) process, may be used to polish the wafer 100. It has been observed that the tile angle θ allows the single-crystal silicon wafer 100 to have a flatter surface as compared to a wafer sawn with a null tilt angle. The wafer 100 with a non-zero tilt angle θ may be referred to as an off-axis wafer 100. Because the grinding, edge rounding and polishing steps all operate to reduce dimensions of the wafer, the single-crystal silicon ingot 10 is formed to have a diameter greater than the desired diameter of the final wafer 100.

Figure 2:
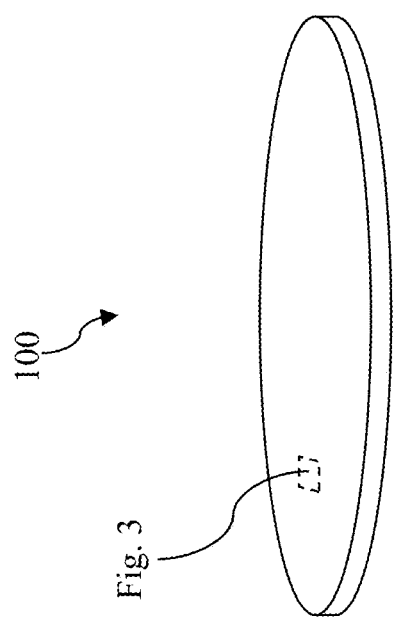
FIG. 2 illustrates a wafer sliced from the single crystal ingot, according to aspects of the present disclosure.
Figure 3:
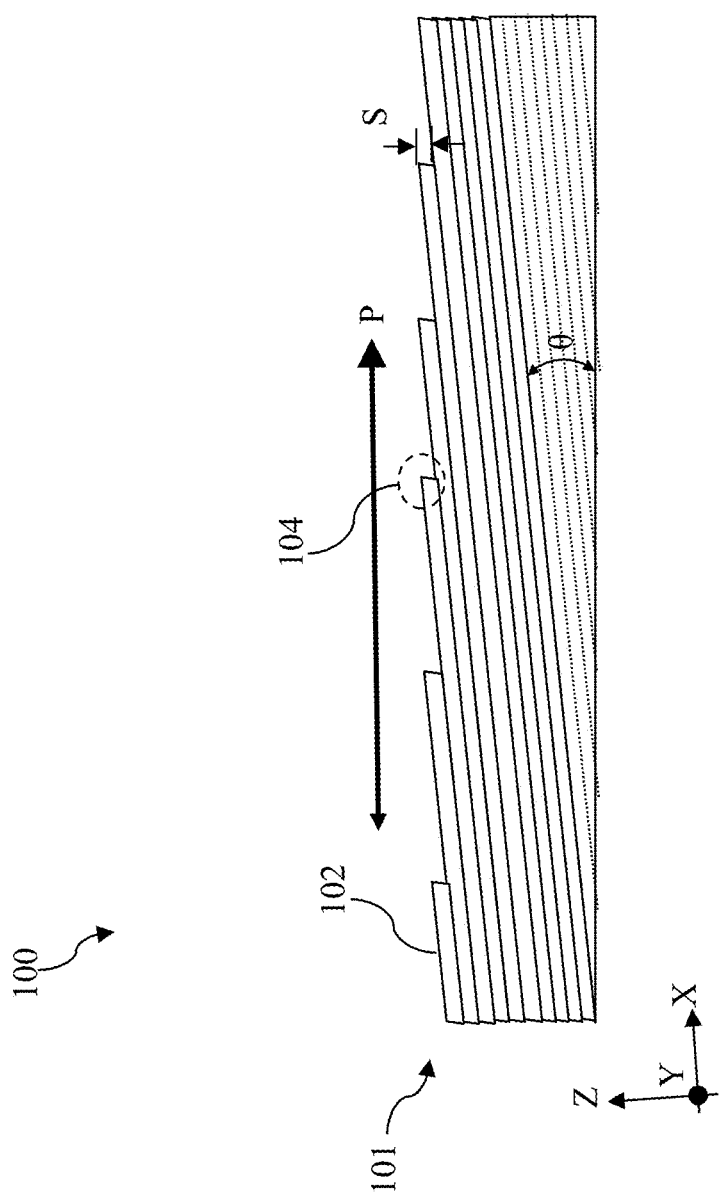
FIG. 3 illustrates an enlarged cross-sectional view of a plurality of atomic steps on a top surface of a wafer, according to aspects of the present disclosure.
Figure 4:
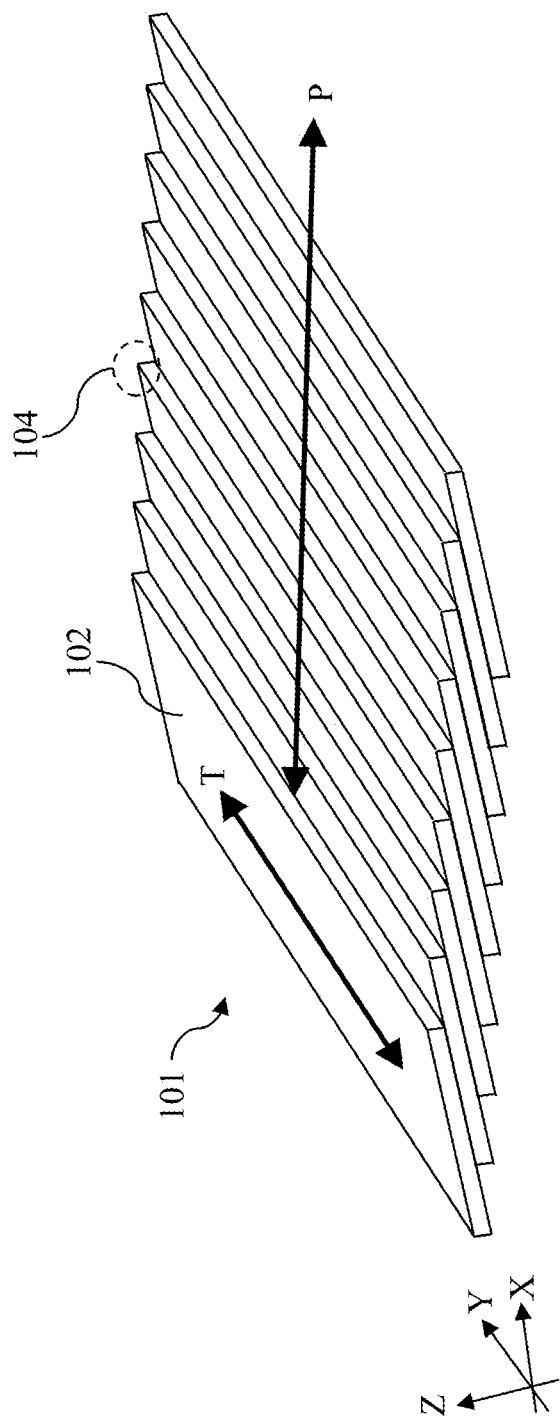
FIG. 4 illustrates a perspective view of a plurality of atomic steps on a top surface of a wafer, according to aspects of the present disclosure.

While the off-axis wafer 100 is macroscopically flat, it includes an atomic step structure when examined microscopically. To illustrate, an enlarged Y-direction cross-sectional view of a portion of a top surface of the wafer 100 in FIG. 2 is provided in FIG. 3. Due to the tilt angle θ at which the wafer 100 is sawn from the single-crystal silicon ingot 10, a top surface of the wafer 100 extends across silicon crystal planes at the tilt angle θ, revealing an atomic step structure 101. The atomic step structure 101 may include a plurality of atomic steps that propagate along an atomic step propagation direction P at the tilt angle θ with respect to the X direction. Each of the plurality of atomic steps includes a terrace 102 and a kink 104. A fragmentary perspective view of the atomic step structure 101 is shown in FIG. 4. As shown in FIG. 4, as the terrace 102 extends along a silicon crystal plane (i.e., the X-Y plane), which may be the (100) crystal plane, the terrace 102 extends flatly and smoothly along a terrace direction T, which is parallel to the Y direction. In contrast, the plurality of atomic steps and kinks 104 are present along the atomic step propagation direction P. As shown in FIG. 3, each of the plurality of atomic steps includes a step height S along the Z direction, which may be between about 2 Å and about 3 Å. It is noted that the X, Y, Z directional convention in FIG. 1 is carried over to FIGS. 3 and 4, as well as subsequent figures.

Charge carriers, including electrons and holes, have different field effect mobilities on different silicon crystal planes. It has been reported that electrons have the highest field effect mobilities on the (100) plane and holes have the highest field effect mobilities on the (110) plane. Semiconductor devices are fabricated on a wafer along orientations to take most advantage of crystal planes with high carrier mobilities. Conventionally, the presence of the atomic step structure 101 is not taken into consideration or at least is not regarded as a predominant factor in deciding along which orientation are semiconductor devices fabricated. For example, when semiconductor devices are fabricated on a wafer based on a layout using some conventional technologies, a direction of active regions/channels in the layout may be aligned with the [110] direction regardless of the presence of the atomic step structure.

When dimensions of semiconductor devices continue to shrink, the presence of the atomic step structure 101 may become a predominant factor affecting charge carrier mobilities in silicon. For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel member wrapped by a gate on more than one side (for example, the gate wraps a top and sidewalls of a "fin" of semiconductor material extending from a substrate). A GAA transistor has a gate structure that can extend, partially or fully, around a channel member to provide access to the channel member on two or more sides. The channel member of the GAA transistor may be formed from nanowires, nanosheets, other nanostructures, and/or other suitable structures.

Figure 5:
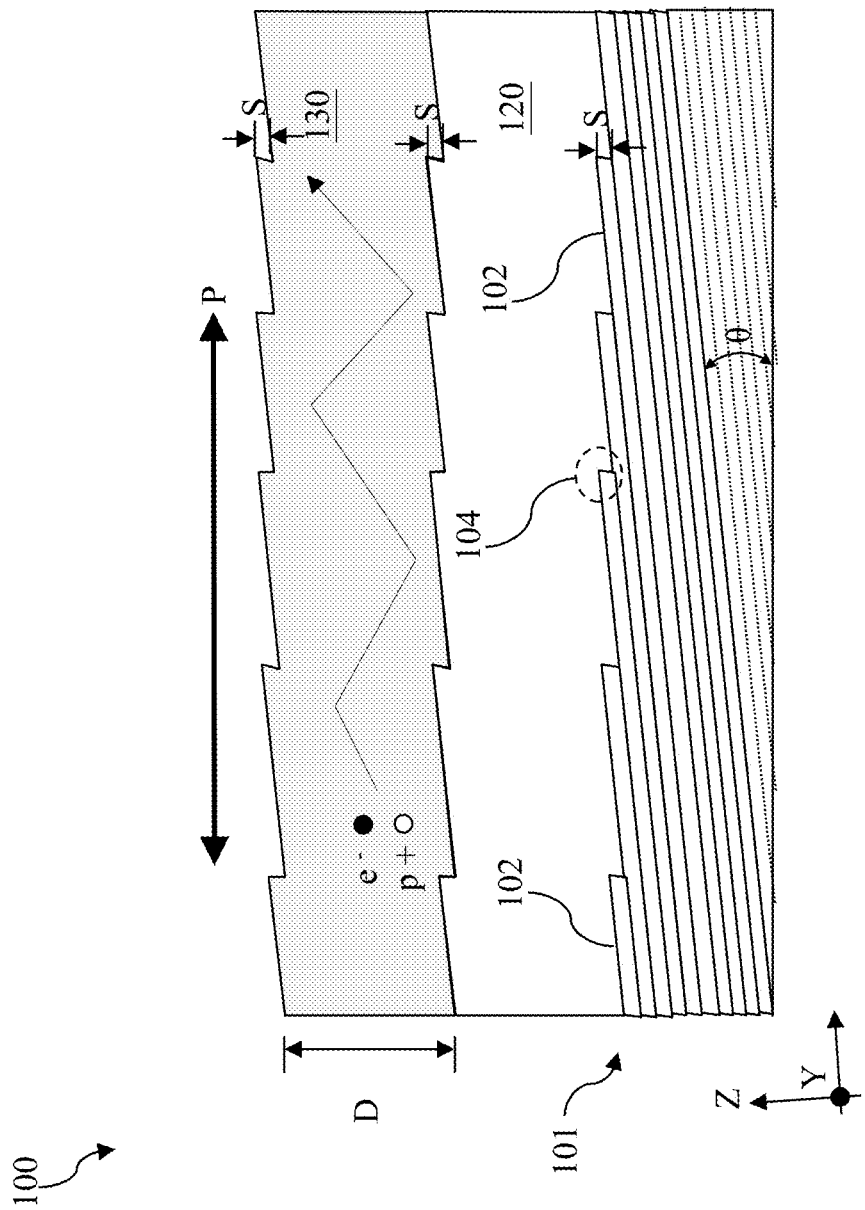
FIG. 5 illustrates a cross-sectional view of epitaxial layers over a plurality of atomic steps on a top surface of a wafer along a first direction, according to aspects of the present disclosure.

Fabrication of a GAA transistor includes forming a stack of alternating semiconductor layers of different semiconductor compositions. When an epitaxial layer is formed on the wafer 100, it has a crystalline structure with a single orientation relative to the wafer 100. As a result, the plurality of atomic steps of the atomic step structure 101 may be substantially duplicated in the epitaxial layer directly on the wafer 100 as well as further epitaxial layers thereover. Reference is now made to FIG. 5, which schematically illustrates a first epitaxial layer 120 deposited over the wafer 100 and a second epitaxial layer 130 deposited over the first epitaxial layer 120. As described above, the atomic step structure 101 on the top surface of the wafer 100 is substantially duplicated in the first epitaxial layer 120 as well as in the second epitaxial layer 130. In some embodiments, the first epitaxial layer 120 is formed of silicon germanium (SiGe) and the second epitaxial layer 130 is formed of silicon (Si). In these embodiments, the first epitaxial layer 120 in a channel region may be selectively removed to release the second epitaxial layer 130 in the channel region to become a channel member of a GAA transistor. Therefore, in terms of their functions in the final semiconductor device, the first epitaxial layer 120 may be referred to as a sacrificial layer and the second epitaxial layer 130 may be referred to as a channel layer. Further silicon germanium layers (sacrificial layers) and silicon layers (channel layers) may be further formed over the second epitaxial layer 130. For simplicity, these further silicon germanium layers and silicon layers are omitted from FIG. 5. In fabrication of a GAA transistor, the stack of interleaving sacrificial layers and channel layers will be patterned into a fin-shaped structure and the sacrificial layers in channel regions will then be removed to release the channel layers into channel members that are vertically stacked. As described above, the channel members may come into the forms of nanowires, nanosheets, other nanostructures, and/or other suitable structures. In some implementations, the second epitaxial layer 130 as well as the overlying silicon layers may have a thickness D (measured from a top surface of the wafer). In some instances, the thickness D may be smaller than 10 nm (i.e., 100 Å). In these instances, a ratio R of the step height S (between about 2 Å and about 3 Å) to the thickness D may be between about 2% and about 3%. In some examples, when a thickness D is between about 3 nm (30 Å) and about 4 nm (40 Å), the ratio of the step height S to the thickness D may be between about 5% and about 10%.

Figure 6:
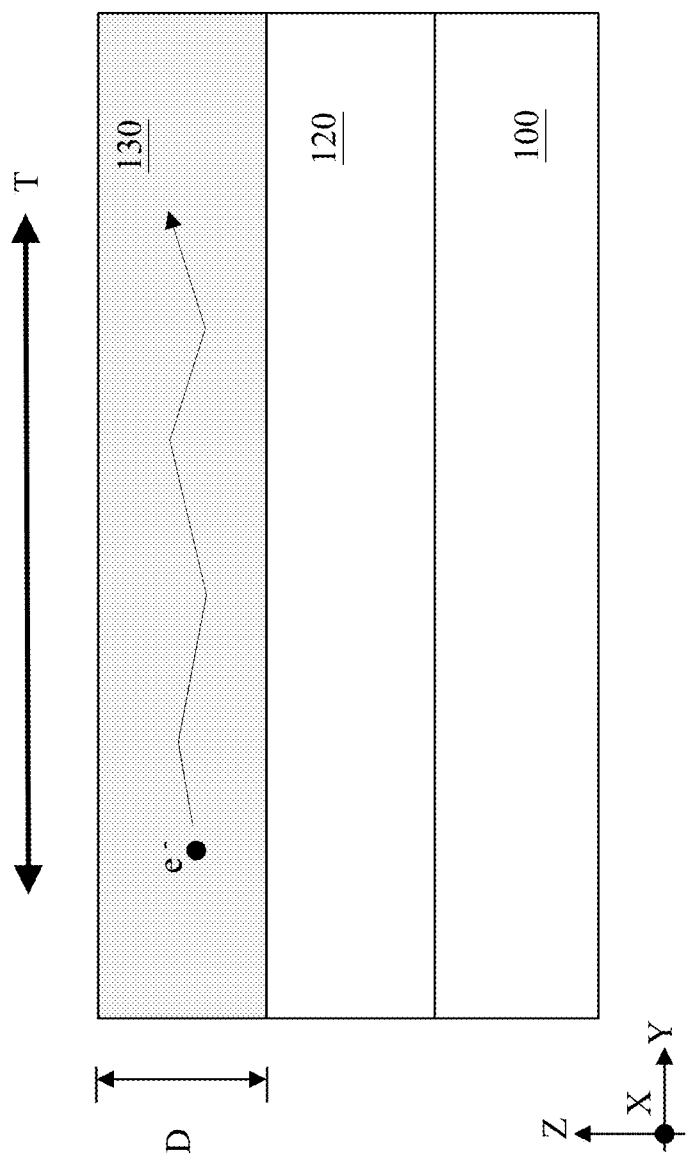
FIG. 6 illustrates a cross-sectional view of epitaxial layers over a plurality of atomic steps on a top surface of a wafer along a second direction, according to aspects of the present disclosure.

As shown in FIG. 5, the plurality of atomic steps in the second epitaxial layer 130 may cause scattering of the charge carriers travelling along the atomic step propagation direction P, thereby reducing field effect carrier mobilities in the second epitaxial layer 130. It has been observed that when the ratio R (of the step height S to the thickness D) is greater than about 2%, the presence of the atomic step structure 101 becomes a predominant factor affecting charge carrier mobility. For example, it has been observed that electron field effect mobility along the silicon crystal direction is about 1380 $cm^2V^{-1} S^{-1}$ (where cm denotes centimeter, V denotes voltage and S denotes second) when the ratio R is less than 2% but drops to about or below 1208 s when the ratio R is greater than 2%. In this regard, 2% is a threshold value for the ratio R in determining whether the presence of the atomic step structure 101 is a predominant factor affecting charge carrier mobility. Put differently, when the ratio R is greater than 2%, scattering due to the atomic step propagation direction P of the atomic step structure 101 trumps the orientation of crystal planes with respect to determining field effect mobilities of charger carriers. Reference is now made to FIG. 6. When charge carriers travel along the terrace direction T in the second epitaxial layer 130, scattering due to atomic steps and kinks are much less significant, resulting in increased field effect mobilities along the terrace direction T. The difference in mobilities along the atomic step propagation direction P and the terrace direction T increases as the thickness D decreases. It follows that when the thickness D of a channel member decreases such that the ratio R is greater than the threshold value (i.e., about 2%), a current flow direction in the channel member should be aligned with the terrace direction T to take advantage of the increased carrier mobilities due to reduced carrier scattering. In terms of the thickness D, the threshold value may be about 10 nm. When the thickness D is below 10 nm, the ratio R is greater than 2%.

Figure 7:
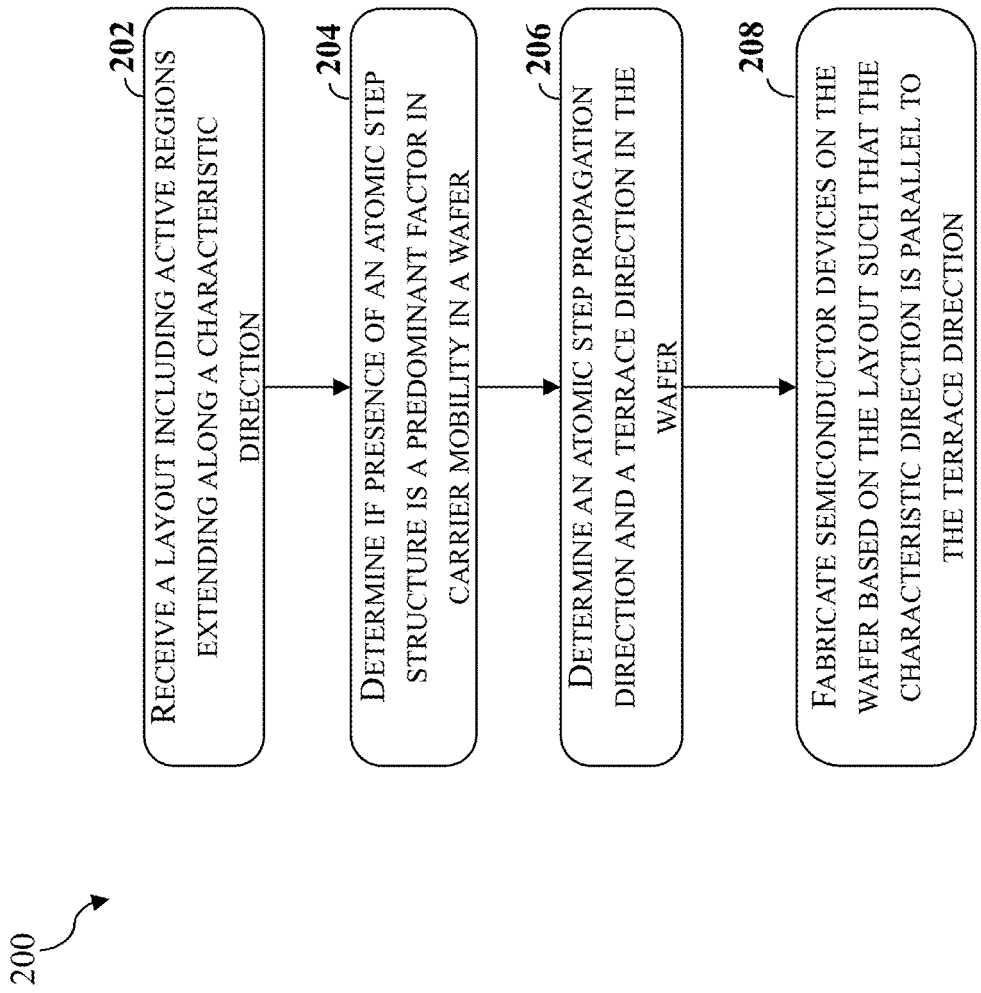
FIG. 7 illustrates a flow chart of a method for fabricating a semiconductor device, according to aspects of the present disclosure.

FIG. 7 illustrates a flowchart of a method 200 of fabricating a semiconductor device. Method 200 is merely an example and is not intended to limit the present disclosure to what is explicitly illustrated in method 200. Additional operations can be provided before, during and after method 200, and some steps described can be replaced, eliminated, or moved around for additional embodiments of the method. Not all operations are described herein in detail for reasons for simplicity. Method 200 is described below in conjunction with FIGS. 8-10. Throughout the present disclosure, similar reference numerals are used to denote similar features.

Figure 8:
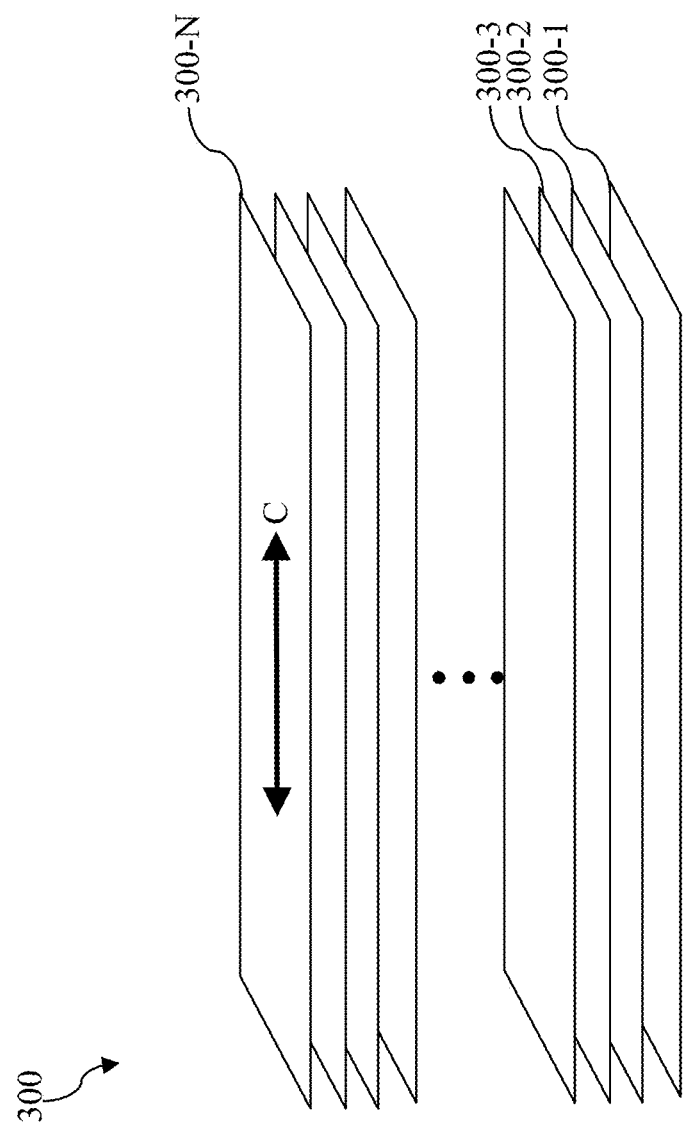
FIG. 8 illustrates the first direction and the second direction relative to the wafer, according to aspects of the present disclosure.

Referring to FIGS. 7 and 8, method 200 includes a block 202 where a layout 300 including active regions extending along a characteristic direction C is received. The layout 300 may be presented in one or more data files having information related to the geometrical patterns used for fabrication of the semiconductor device 400, shown in FIGS. 10 and 11 below. In some examples, the layout 300 may be expressed in a GDSII file format or DFII file format. In some embodiments, the layout 300 may include a plurality of layers 300-1, 300-2, 300-3, to 300-N. In some implementations, transistors in the layout 300 have channel members that are uniformly aligned along a characteristic direction C. Because channel members are disposed in active regions, active regions in the plurality of layers in the layout 300 are also aligned along the characteristic direction C. The layout 300 includes dimension of various features therein, including dimensions of channel members in the layout 300.

Referring to FIG. 7, method 200 includes a block 204, which determines whether presence of an atomic step structure is a predominant factor affecting carrier mobility in a wafer 100. Commercially available wafers may have a (100) surface as the (100) silicon crystal plane has the highest electron field effect mobility. In some embodiments, the determination at block 204 may be based on a ratio R of a step height S of the atomic step structure to a thickness D (or an average thickness) of channel members in the layout 300.

As described above, when an atomic step structure, such as the atomic step structure 101 shown in FIG. 5, is present, atomic steps in the atomic step structure may each have a step height S. Because the step height S is intrinsic to a single-crystal silicon wafer and only varies minimally with a tilt angle θ, the step height S may fall within a range between about 2 Å and about 3 Å and may be largely uniform from wafer to wafer. With the step height S substantially fixed, the ratio R is substantially determined by the thickness D of the channel members in the layout 300. As described above, when the thickness D is equal to or smaller than 10 nm, the ratio R may be greater than 2% and the presence of the atomic step structure is a predominant factor affecting field effect mobilities of charge carriers. Therefore, in some implementations, operations at block 204 include extracting channel member thickness data from the layout 300 and deriving the ratio R based on the channel member thickness data and the step height S.

Depending on the types of transistors present in the layout 300, the thickness D for the purpose of obtaining ratio R at block 204 may be selected such that the performance of the semiconductor device may be improved by taking advantage of the increased carrier mobilities along the terrace direction T. Some examples are provided. When all the transistors in the layout 300 are GAA transistors with a substantially uniform channel member thickness, the thickness D for the purpose of obtaining ratio R at block 204 may be the substantially uniform channel member thickness. When all the transistors in the layout 300 are GAA transistors having different channel member thicknesses, the thickness D for the purpose of obtaining ratio R at block 204 may be a minimum thickness, an average thickness, a mean thickness, or a median thickness of the different channel member thicknesses. When the layout 300 includes GAA transistors as well as other types of transistors, and these GAA transistors have a substantially uniform channel member thickness, the thickness D for the purpose of obtaining ratio R at block 204 may be the substantially uniform channel member thickness. When the layout 300 includes GAA transistors as well as other types of transistors and these GAA transistors have different channel member thicknesses, the thickness D for the purpose of obtaining ratio R at block 204 may be a minimum thickness, an average thickness, a mean thickness, or a median thickness of the different channel member thicknesses. In some embodiments, the thickness D for the purpose of obtaining ratio R at block 204 may a representative thickness selected based on functions of the transistors. In some instances, the layout 300 includes logic GAA transistors performing logic operations ("logic GAA transistors"). To achieve high performance and fast switching in logic GAA transistors, the representative thickness may be based on the channel member thickness(es) in logic GAA transistors. When the logic GAA transistors have a substantially uniform channel member thickness, the thickness D for the purpose of obtaining ratio R at block 204 may be the substantially uniform channel member thickness. When the logic GAA transistors have different channel member thicknesses, the representative thickness for the purpose of obtaining ratio R at block 204 may be a minimum thickness, an average thickness, a mean thickness, or a median thickness of the different channel member thicknesses in the logic GAA transistors.

Figure 9:
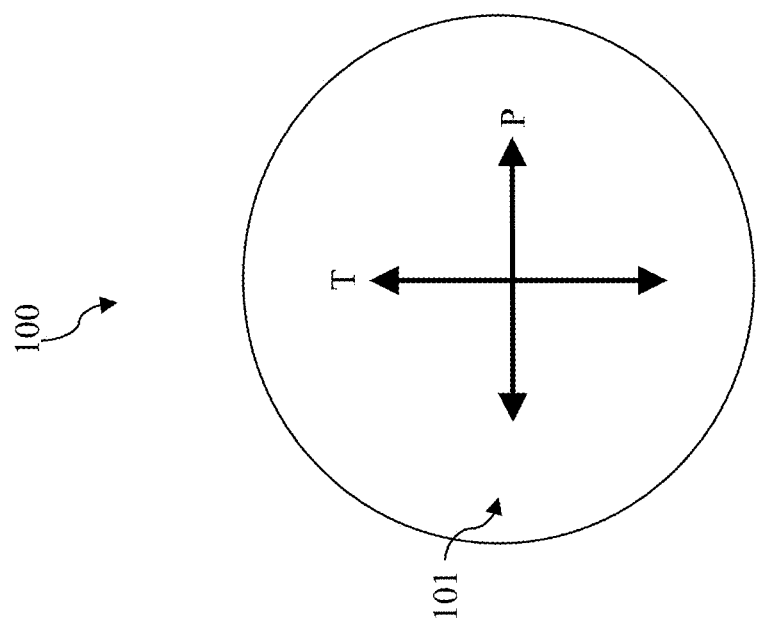
FIG. 9 is a schematic illustration of a layout, according to aspects of the present disclosure.

Referring to FIGS. 7 and 9, method 200 includes a block 206 where an atomic step propagation direction P and a terrace direction T in the wafer 100 are determined. In some embodiments, the manufacturer of the wafer 100 may outright provide the direction and value of the tilt angle θ. In those embodiments, the atomic step propagation direction P and the terrace direction T may be determined relative to flats or notches on the wafer 100. In other embodiments, atomic force microscopy (AFM) techniques may be used to survey the atomic step structure on the wafer 100 so as to determine the atomic step propagation direction P and the terrace direction T. In some alternative embodiments, X-ray diffraction (XRD) techniques may be used to examine the atomic step structure so as to determine the atomic step propagation direction P and the terrace direction T. In still other embodiments, other surface or composition characterization tools may be used so long as those tools have sufficiently high resolutions to identify the atomic step propagation direction P and the terrace direction T.

Figure 10:
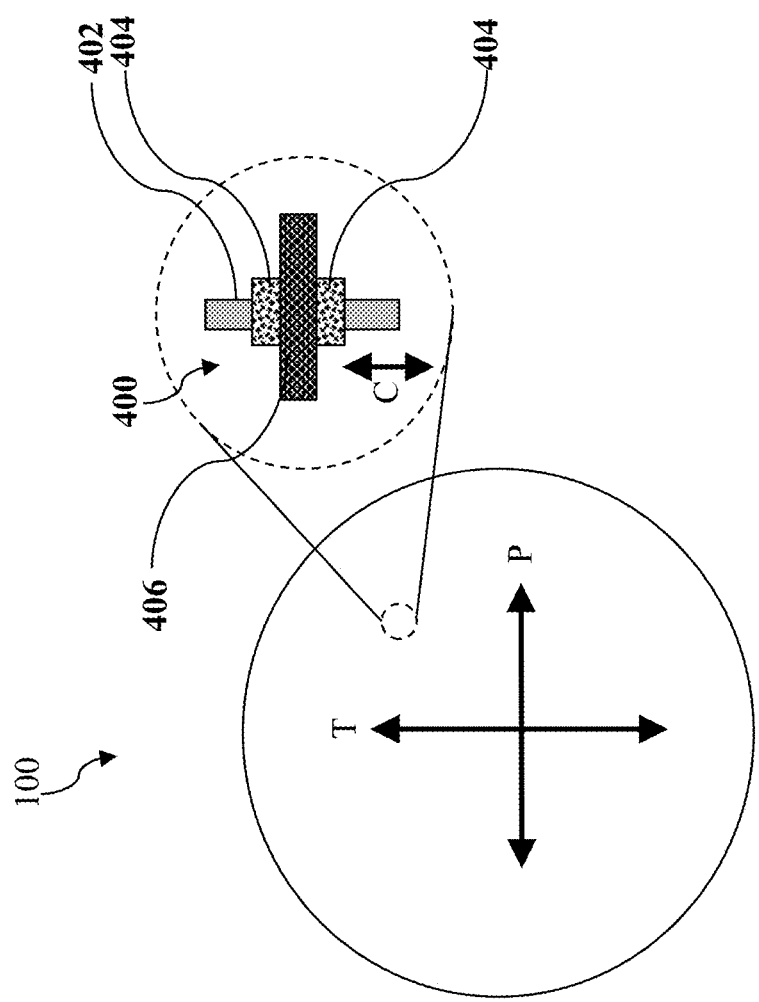
FIG. 10 is a schematic illustration of a transistor fabricated on the wafer based on the layout, according to aspects of the present disclosure.

Referring to FIGS. 7 and 10, method 200 includes a block 208 where a semiconductor device 400 is fabricated on the wafer 100 based on the layout 300 such that the characteristic direction C is parallel to the terrace direction T. Because the terrace direction T is perpendicular to the atomic step propagation direction P, the semiconductor device 400 is fabricated on the wafer 100 based on the layout 300 such that the characteristic direction C is perpendicular to the atomic step propagation direction P. The semiconductor device 400 may be a multi-gate device, such as a GAA transistor. As shown in FIG. 10, the semiconductor device 400 includes an active region 402, a gate structure 406 disposed over a channel region of the active region 402, and source/drain features 404 over source/drain regions that sandwich the channel region. The active region 402 extend lengthwise along the characteristic direction C that is aligned with or parallel to the terrace direction T. Because the terrace direction T is perpendicular to the atomic step propagation direction P, the characteristic direction C of the active region 402 is also perpendicular to the atomic step propagation direction P.

Figure 11:
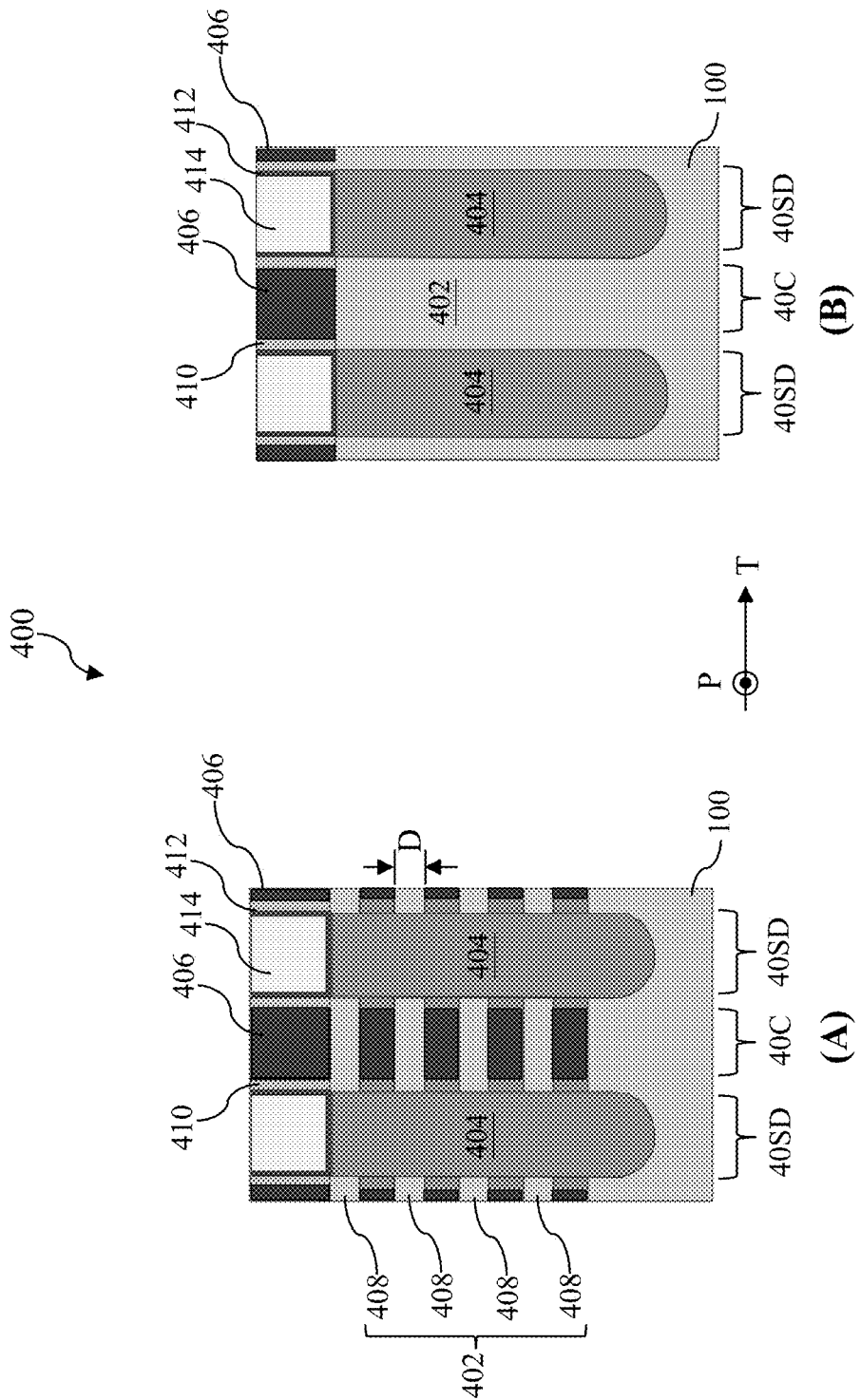
FIG. 11 illustrates examples of the transistor in FIG. 10, according to aspects of the present disclosure.

Example semiconductor devices 400 fabricated using methods of the present disclosure are shown in FIG. 11. In some embodiments, the semiconductor device 400 is a gate-all-around (GAA) transistor, as illustrated in FIG. 11A. In these embodiments, the semiconductor device 400 includes a plurality of channel members 408, each of which is a part of an active region 402. The gate structure 406 is disposed over the channel region 40C of the active region 402 and wraps around each of the channel members 408 in the channel region 40C. As described above, the gate structure 406 is formed after channel members 408 are released by removal of the sacrificial layers in the channel region 40C. In some implementations, the gate structure 406 may include an interfacial layer to interface the channel members 408, a gate dielectric layer over the interfacial layers, one or more work function layers over the gate dielectric layer, and a metal fill layer over the one or more work function layers. The interfacial layer may include silicon oxide. The gate dielectric may include a high-K dielectric layer, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfZrO$, $HfLaO$, $HfSiO$, $LaSiO$, $AlSiO$, $HfTaO$, $HfTiO$, $(Ba,Sr)TiO_3$ (BST), $Al_2O_3$, $Si_3N_4$, oxynitrides (SiON), combinations thereof, or other suitable material. The one or more work function layers may include titanium nitride, aluminum nitride, titanium aluminum nitride, titanium, or aluminum. The metal fill layer may include copper, ruthenium or tungsten. The semiconductor device 400 also includes source/drain features 404 in the source/drain regions 40SD. The source/drain feature 404 may be formed of silicon doped with an n-type dopant, such as phosphorus (P), when the semiconductor device 400 is an n-type GAA transistor. When the semiconductor device 400 is a p-type GAA transistor, the source/drain feature 404 may be formed of silicon germanium doped with a p-type dopant, such as boron (B). In some implementations where a gate replacement process is adopted, the source/drain features 404 are formed when the channel region 40C is protected by a dummy gate stack lined by a gate spacer layer 410. After the source/drain features 404 are deposited in the source/drain regions 40SD, an etch stop layer (ESL) 412 is deposited over the source/drain features 404 and an interlayer dielectric (ILD) layer 414 is deposited over the ESL 412. A chemical mechanical polishing (CMP) is then used to expose the dummy gate stacks. The ESL 412 may be formed of silicon nitride. The ILD layer 414 may include material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dummy gate stacks are removed to form a gate trench to expose the sacrificial layers and channel layers in the channel region 40C. The sacrificial layers are selectively removed to release the channel members 408. Thereafter, the gate structure 406 is formed in the gate trench such that the gate structure 406 wraps around each of the channel members 408.

Because the characteristic direction C is aligned with the terrace direction T when the semiconductor device 400 is fabricated, each of the channel members 408 also extends along the terrace direction T. In addition, each of the channel members 408 has a thickness D along a direction perpendicular to the wafer 100 and the thickness D is smaller than 10 nm, such as between 3 nm and 4 nm. The gate structure 406 extends over the channel region 40C across the active region 402 along the atomic step propagation direction P. While not shown in FIG. 11A, each of the channel members 408 has a width along the atomic step propagation direction P. In some embodiments, the width is greater than the thickness D and each of the channel members 408 has a sheet-like cross-section. In these embodiments, each of the channel members 408 may be referred to as a nanosheet.

As illustrated in FIG. 11B, the semiconductor device 400 may be a FinFET. Different from a GAA transistor, a FinFET includes one fin-like channel member in the active region 402, instead of a vertical stack of channel members. The FinFET in FIG. 11B also includes a gate structure 406 over a channel region 40C of the active region 402 and source/drain features 404 over the source/drain regions 40SD. An ESL 412 is disposed over the source/drain features 404 and an ILD layer 414 is disposed over the ESL 412. In some embodiments, the height of the fin-like channel member may be smaller than 10 nm and the presence of the atomic step structure is a predominant factor affecting charge carrier mobility in the fin-like channel member. In some alternative embodiments, the layout 300 may include GAA transistors and FinFETs having active regions extending along the characteristic direction C. In these alternative embodiments, the GAA transistors may include channel members with a thickness smaller than 10 nm and the FinFETs may include fin-like channel members with a thickness greater than 10 nm. When methods according to the present disclosure are performed, the characteristic direction C is aligned with the terrace direction T due to the channel member thickness in these GAA transistors. Because active regions for the FinFETs and GAA transistors are aligned along the same characteristic direction C, active regions of the FinFETs are also aligned with the terrace direction T. Put differently, in these alternative embodiments, the fact that active regions of FinFETs are aligned with the terrace direction T is a collateral result of the less-than-10 nm channel member thickness in the GAA transistor.

Although not intended to be limiting, one or more embodiments of the present disclosure provide many benefits to a semiconductor device and the formation thereof. For example, embodiments of the present disclosure provide methods to take into consideration the presence of an atomic step structure on a wafer despite of the crystal plane of the wafer and align the active regions with a direction to avoid carrier scattering. An atomic step structure includes a plurality of atomic steps that propagate along an atomic step propagation direction P and each of the plurality of atomic steps includes a kink-free terrace extending along a terrace direction T. Compared to the atomic step propagation direction P, charge carriers traveling along the terrace direction T experience less scattering and have a greater field effect mobility. By aligning the direction of the active regions to the terrace direction T, methods of the present disclosure provide semiconductor devices with improved performance.

In one exemplary aspect, the present disclosure is directed to a semiconductor device. The semiconductor device includes a substrate including a plurality of atomic steps that propagate along a first direction and a transistor disposed on the substrate. The transistor includes a channel member extending a second direction perpendicular to the first direction, and a gate structure wrapping around the channel member.

In some embodiments, the substrate consists essentially of silicon (Si). In some implementations, each of the plurality of atomic steps includes a terrace that extends along the second direction. In some embodiments, the second direction includes a [−110] crystal direction of the substrate. In some implementations, the transistor further includes a plurality of channel members over the channel member and the gate structure wraps around each of the plurality of channel members.

In another exemplary aspect, the present disclosure is directed to a method. The method includes receiving a wafer including a plurality of atomic steps, determining an atomic step propagation direction of the plurality of atomic steps, receiving a layout including a plurality of transistors, each of the plurality of transistors including a channel member extending along a characteristic direction, and fabricating the plurality of transistors on the wafer based on the layout such that the characteristic direction is perpendicular to the atomic step propagation direction.

In some embodiments, the determining of the atomic step propagation direction includes examining the plurality of atomic steps using atomic force microscopy (AFM). In some implementations, the determining of the atomic step propagation direction includes examining the plurality of atomic steps using X-Ray diffraction (XRD). In some instances, the plurality of transistors includes a plurality of gate-all-around (GAA) transistors. In some implementations, each of the plurality of transistors includes a vertical stack of channel members and the channel member is one of the vertical stack of channel members. In some instances, the method may further include determining whether presence of the plurality of atomic steps is a predominant factor affecting carrier mobility in the channel member. In some embodiments, the determining includes obtaining a ratio of a step height of each of the plurality of atomic steps to a thickness of the channel member and comparing the ratio to a threshold value. In some instances, the threshold value is about 2%.

In yet another exemplary aspect, the present disclosure is directed to a method. The method includes receiving a wafer having a plurality of atomic steps, receiving a layout including a plurality of transistors, each of the plurality of transistors including a channel member extending along a characteristic direction, determining whether presence of the plurality of atomic steps is a predominant factor affecting carrier mobility in the channel member, when the presence of the plurality of atomic steps is a predominant factor affecting carrier mobility in the channel member, determining an atomic step propagation direction of the plurality of atomic steps, and fabricating the plurality of transistors on the wafer based on the layout such that the characteristic direction is perpendicular to the atomic step propagation direction.

In some implementations, the determining of the atomic step propagation direction includes examining the plurality of atomic steps using atomic force microscopy (AFM). In some implementations, the determining of the atomic step propagation direction includes examining the plurality of atomic steps using X-Ray diffraction (XRD). In some embodiments, the determining includes determining a height of each of the plurality of atomic steps, determining a thickness of the channel member, determining a ratio of the height to the thickness, and comparing the ratio to a threshold value. In some instances, the threshold value is about 2%. In some embodiments, the plurality of transistors includes a plurality of gate-all-around (GAA) transistors. In some embodiments, each of the plurality of transistors includes a vertical stack of channel members and the channel member is one of the vertical stack of channel members.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a substrate comprising a plurality of atomic steps that propagate along a first direction; and
   a transistor disposed on the substrate, wherein the transistor comprises:
      a channel member extending lengthwise along a second direction perpendicular to the first direction, and
      a gate structure wrapping around the channel member.

2. The semiconductor device of claim 1, wherein the substrate consists essentially of silicon (Si).

3. The semiconductor device of claim 1, wherein each of the plurality of atomic steps comprises a terrace that extends along the second direction.

4. The semiconductor device of claim 1, wherein the second direction comprises a [−110] crystal direction of the substrate.

5. The semiconductor device of claim 1,
   wherein the transistor further comprises a plurality of channel members over the channel member,
   wherein the gate structure wraps around each of the plurality of channel members.

6. The semiconductor device of claim 1, wherein the gate structure extends lengthwise along the first direction.

7. The semiconductor device of claim 1, wherein the channel member extends between a first source/drain feature and a second source/drain feature along the second direction.

8. A semiconductor structure, comprising:
   a silicon substrate comprising a plurality of atomic steps that propagate along a first direction; and
   a plurality of transistors disposed over the silicon substrate, each of the plurality of transistors comprises:
      an active region disposed over the silicon substrate and extending lengthwise along a second direction perpendicular to the first direction, and
      a gate structure wrapping over the active region and extending lengthwise along the first direction,
   wherein the active region comprises a plurality of channel members vertically stacked one over another,
   wherein the gate structure wraps around each of the plurality of channel members.

9. The semiconductor structure of claim 8, wherein each of the plurality of atomic steps comprises a step height between about 2 Å and 3 Å.

10. The semiconductor structure of claim 9,
    wherein each of the plurality of channel members comprises a thickness,
    wherein a ratio of the step height to the thickness is between about 2% and about 3%.

11. The semiconductor structure of claim 8,
    wherein the active region comprises a semiconductor fin,
    wherein the gate structure wraps over the semiconductor fin.

12. The semiconductor structure of claim 8, wherein the active region extending between a first source/drain feature and a second source/drain feature.

13. The semiconductor structure of claim 8, wherein the first direction and a surface of one of the plurality of atomic steps form an angle between about 1° and 4°.

14. The semiconductor structure of claim 8, wherein the second direction is aligned with a [−110] crystal direction of the silicon substrate.

15. The semiconductor structure of claim 12, wherein each of the first source/drain feature and the second source/drain feature extends into the silicon substrate.

16. A semiconductor structure, comprising:
    a silicon substrate comprising a plurality of atomic steps propagating along a first direction; and
    a multi-gate transistor comprising:
       a first source/drain feature and a second source/drain feature disposed over the silicon substrate,
       a vertical stack of channel members extending between the first source/drain feature and the second source/drain feature along a second direction perpendicular to the first direction, and
       a gate structure wrapping around each of the vertical stack of channel members.

17. The semiconductor structure of claim 16, wherein the silicon substrate is single-crystalline.

18. The semiconductor structure of claim 16, wherein the multi-gate transistor further comprising:
    an interlayer dielectric layer disposed over the first source/drain feature and the second source/drain feature; and
    a gate spacer disposed between the gate structure and the interlayer dielectric layer.

19. The semiconductor structure of claim 18, wherein the multi-gate transistor further comprising:
    a contact etch stop layer extending continuously from between the gate structure and the interlayer dielectric layer to between the interlayer dielectric layer and the first source/drain feature.

20. The semiconductor structure of claim 18, wherein the first source/drain feature and the second source/drain feature are in direct contact with the silicon substrate.

\* \* \* \* \*